US012694315B2

(12) United States Patent
Budinski et al.

(10) Patent No.: US 12,694,315 B2
(45) Date of Patent: Jul. 28, 2026

(54) QUANTUM ALGORITHM UTILIZING LATTICE BOLTZMANN METHOD

(71) Applicant: Quanscient Oy, Tampere (FI)

(72) Inventors: Ljubomir Budinski, Tampere (FI); Ossi Niemimäki, Tampere (FI); Valtteri Lahtinen, Tampere (FI)

(73) Assignee: Quanscient Oy

( * ) Notice: Subject to any disclaimer, the term of this patent is extended or adjusted under 35 U.S.C. 154(b) by 791 days.

(21) Appl. No.: 18/165,819

(22) Filed: Feb. 7, 2023

(65) Prior Publication Data

US 2024/0265285 A1 Aug. 8, 2024

(51) Int. Cl.
*G06N 10/20* (2022.01)
*G06F 30/28* (2020.01)

(52) U.S. Cl.
CPC ............. *G06N 10/20* (2022.01); *G06F 30/28* (2020.01)

(58) Field of Classification Search
CPC ................................ G06F 30/28; G06N 10/40
USPC ............. 326/1; 977/839, 933; 713/1; 706/62
See application file for complete search history.

(56) References Cited

U.S. PATENT DOCUMENTS 11,694,107 B1 * 7/2023 Budinski ................ G06N 10/20
706/62

OTHER PUBLICATIONS

Budinski Ljubomir Ed—Hirota Osamu et al, "Quantum algorithm for the advection-diffusion equation simulated with the lattice Boltzmann method", Quantum Information Processing, vol. 20 No. 2, Published Feb. 5, 2021, ISSN: 1570-0755, Doi: 10.1007/S11128-021-02996-3,17 Pages.

Budinski Ljubomir, "Quantum algorithm for the Navier-Stokes equations by using the streamfunction-vorticity formulation and the lattice Boltzmann method", arXiv (Cornell University), DOI: 10.48550/arxiv.2013.03804, Published Mar. 15, 2021, 20 Pages.

European Patent Office, Notification of Transmittal of the International Search Report and the Written Opinion of the International Searching Authority, or the Declaration, International Application No. PCT/FI2023/050655, Mailed Feb. 23, 2024, 14 Pages.

Ljubomir Budinski, "Efficient parallelization of quantum basis state shift", arxiv. org, Cornell University Library Cornell Univeristy Ithaca, NY 14853, Published Apr. 4, 2023, 9 Pages.

Vivek V. Shende et al, "Synthesis of Quantum Logic Circuits", arxiv.org, Cornell Univeristy Library, Ithaca, NY 14853, Published Jun. 23, 2004, DOI: 10.1109/TCAD.2005.855930, 19 Pages.

* cited by examiner

*Primary Examiner* — Arnold M Kinkead
(74) *Attorney, Agent, or Firm* — Ziegler IP Law Group, LLC.

(57) ABSTRACT

Disclosed is a method for setting up a quantum circuit utilizing a lattice Boltzmann method. An initialization step is performed by setting up for the quantum circuit, a first quantum register, a second quantum register and at least a first ancilla register. The quantum circuit is applied to the first quantum register, the second quantum register and the first ancilla register, wherein the quantum circuit includes in a sequential order: a collision step constructed using a first set of quantum gates; a propagation step constructed using a second set of quantum gates; and a macroscopic variables calculation step constructed using a third set of quantum gates.

14 Claims, 7 Drawing Sheets

100

100B

QUANTUM ALGORITHM UTILIZING LATTICE BOLTZMANN METHOD

TECHNICAL FIELD

The present disclosure relates to methods for setting up a quantum circuit utilizing a lattice Boltzmann method. Moreover, the present disclosure relates to a quantum computer or a quantum simulator configured to execute the aforesaid methods. Furthermore, the present disclosure also related to a non-transitory computer-readable medium having computer program instructions stored thereon, the computer program instructions being executable by at least one processor in a classical computer to control a quantum computer or a quantum simulator to perform the aforesaid methods.

BACKGROUND

Currently available quantum algorithms for solving multiphysics problems are exclusively designed for application on fault-tolerant quantum devices (namely, perfect devices having error-correction and minimal noise). This is mainly due to the complexity of quantum circuits, which are too large for application on currently accessible NISQ (noisy intermediate-scale quantum) devices. Thus, in that sense, further redesign and optimization of the quantum algorithms is required.

SUMMARY

The present disclosure seeks to provide an improved method for setting up a quantum circuit utilizing a lattice Boltzmann method. Moreover, the present disclosure seeks to provide a quantum computer or a quantum simulator configured to execute the aforesaid method. The present disclosure also seeks to provide a non-transitory computer-readable medium having computer program instructions stored thereon, the computer program instructions being executable by at least one processor in a classical computer to control a quantum computer or a quantum simulator to perform the aforesaid method.

In a first aspect, an embodiment of the present disclosure provides a method for setting up a quantum circuit utilizing a lattice Boltzmann method, the method comprising:

performing an initialization step by setting up for the quantum circuit, a first quantum register (f1), a second quantum register (f2) and at least a first ancilla register (a, a1), wherein the first quantum register (f1) comprises four qubits ($f1_0$, $f1_1$, $f1_2$, $f1_3$), the second quantum register (f2) comprises N−4 qubits ($f2_0$, . . . $f2_{N-5}$), and the first ancilla register (a, a1) comprises an ancilla qubit; and applying the quantum circuit to the first quantum register (f1), the second quantum register (f2) and the first ancilla register (a, a1), wherein the quantum circuit comprises in a sequential order:

(i) a collision step constructed using a first set of quantum gates;

(ii) a propagation step constructed using a second set of quantum gates; and (iii) a macroscopic variables calculation step constructed using a third set of quantum gates.

In a second aspect, an embodiment of the present disclosure provides a quantum computer or a quantum simulator configured to execute the aforementioned method according to the first aspect.

In a third aspect, an embodiment of the present disclosure provides a non-transitory computer-readable medium having computer program instructions stored thereon, the computer program instructions being executable by at least one processor in a classical computer to control a quantum computer or a quantum simulator to perform the aforementioned method according to the first aspect.

Embodiments of the present disclosure substantially eliminate, or at least partially address the aforementioned problems in the prior art, and facilitate a quantum circuit that is efficient and less prone to error.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

DETAILED DESCRIPTION OF EMBODIMENTS

Figure 1A:
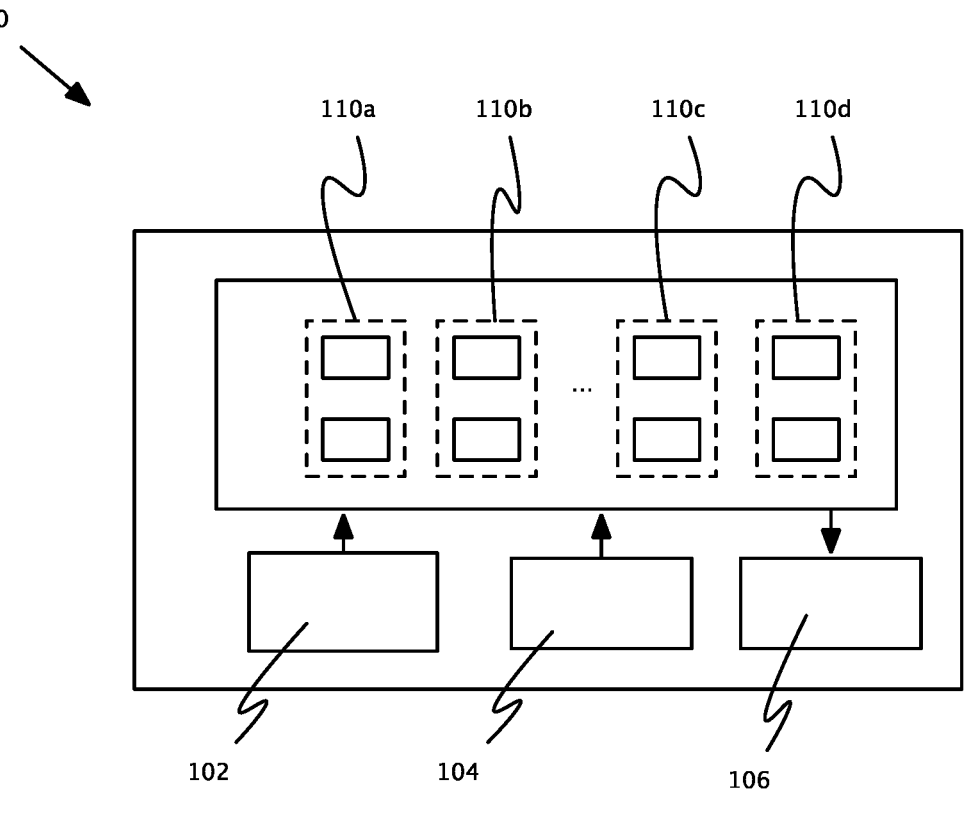
FIG. 1A is a schematic illustration of a quantum computer.

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In a first aspect, an embodiment of the present disclosure provides a method for setting up a quantum circuit utilizing a lattice Boltzmann method, the method comprising:

performing an initialization step by setting up for the quantum circuit, a first quantum register (f1), a second quantum register (f2) and at least a first ancilla register (a, a1), wherein the first quantum register (f1) comprises four qubits (f1$_0$, f1$_1$, f1$_2$, f1$_3$), the second quantum register (f2) comprises N−4 qubits (f2$_0$, . . . f2$_{N-5}$), and the first ancilla register (a, a1) comprises an ancilla qubit; and applying the quantum circuit to the first quantum register (f1), the second quantum register (f2) and the first ancilla register (a, a1), wherein the quantum circuit comprises in a sequential order:

(i) a collision step constructed using a first set of quantum gates;

(ii) a propagation step constructed using a second set of quantum gates; and (iii) a macroscopic variables calculation step constructed using a third set of quantum gates.

In a second aspect, an embodiment of the present disclosure provides a quantum computer or a quantum simulator configured to execute the aforementioned method according to the first aspect.

In a third aspect, an embodiment of the present disclosure provides a non-transitory computer-readable medium having computer program instructions stored thereon, the computer program instructions being executable by at least one processor in a classical computer to control a quantum computer or a quantum simulator to perform the aforementioned method according to the first aspect.

One of the main advantages of utilizing the lattice Boltzmann method (LBM) is that it allows for a simple, yet efficient implementation of equations governing various physical processes. This will be apparent from comparative examples provided later.

Optionally, the method further comprises simulating a physical process by performing the collision step, the propagation step and the macroscopic variables calculation step of the quantum circuit. The method is suitable for simulating a physical process that is in the domain of the lattice Boltzmann application. The simulation of the physical process on a quantum computer requires a mapping between a classical system (represented using a classical computer) and a quantum system (represented using the quantum computer). Optionally, for this purpose, the method further comprises:

generating a mathematical formulation corresponding to the physical process;

numerically discretizing the mathematical formulation by using the lattice Boltzmann method; and constructing the collision step, the propagation step and the macroscopic variables calculation step of the quantum circuit, based on the numerically-discretized mathematical formulation.

The physical process is described by its corresponding mathematical formulation. The mathematical formulation could be a partial differential equation. In one implementation, the mathematical formulation is a one-dimensional advection-diffusion equation. In this regard, the physical process is an advection-diffusion process, namely a process where both advection and diffusion take place simultaneously, and both advection and diffusion are governed by the advection-diffusion equation. As an example, the mathematical formulation (namely, the advection-diffusion equation) could be represented as follows:

$$\frac{\partial \phi}{\partial t} + \frac{\partial (u_i \phi)}{\partial x_i} = \frac{\partial}{\partial_i}\left(D\frac{\partial \phi}{\partial x_i}\right)$$

where

'$\phi$' represents a dependent variable (for example, such as mass, momentum, energy, species, etc.), 't' represents time, '$x_i$' represents a Cartesian coordinate, '$u_i$' represents a fluid velocity in an i-direction, and 'D' represents a diffusion coefficient.

The above-mentioned equation is valid for a general advection and diffusion phenomena, including both steady and unsteady situations.

After the generation of the mathematical formulation (corresponding to the physical process), the mathematical formulation is numerically discretized by using the lattice Boltzmann method (LBM). A high level of analogy between the LBM and the quantum system allows using the LBM as a foundation for multiphysics quantum algorithms, in contrast to other standard numerical techniques (for example, such as the finite-volume method, the finite-difference method, and the like).

After discretization, the corresponding quantum circuit is constructed. In this regard, sets of quantum gates and corresponding procedures are devised to build a mapping between the classical system and the quantum system. Qiskit, an IBM open-source SDK platform, could be used for this purpose. It will be appreciated here that the method is not restricted to any single platform; any one of various available SDKs for working with quantum computers can be used. For purposes of the present disclosure, a simulation of the quantum circuit is run on a quantum computer, which is preferably equipped with a certain degree of error correction capability.

The presence of the analogy between the LBM and the quantum system makes it possible to map the discretized mathematical formulation (corresponding to the physical process) to a quantum computing framework directly (this methodology is referred as 'quantum native'). This means that the physical process can be simulated on the quantum computer solely by applying an evolution of the quantum states encoding various physical variables. In other words, there is no need of performing any additional procedures (for example, such as switching between different types of information encoding or classical computations (hybrid)) during different time steps of the quantum simulation.

Optionally, the method further comprises obtaining initialization parameters, wherein the initialization parameters are to be utilized during the initialization step. During the initialization step, the initialization parameters (corresponding to the physical process) and input vector(s) having an initial state in the LBM framework are set. Optionally, in this regard, an initialization of an arbitrary vector into a corresponding quantum state is achieved by using a reverse iterative procedure. It will be appreciated that the reverse iterative procedure is a part of the Qiskit framework. The reverse iterative procedure is described, for example, in "Synthesis of Quantum-Logic Circuits" by V. V. Shende et al. published in IEEE Trans. on Computer-Aided Design, vol. 25, no. 6, June 2006, pp. 1000-1010, which has been incorporated herein by reference.

The LBM can be divided into three main steps:

(i) the collision step (constructed using the first set of quantum gates), (ii) the propagation step (constructed using the second set of quantum gates), and (iii) the macroscopic variables calculation step (constructed using the third set of quantum gates).

Combining the aforementioned three steps together results in a formation of the quantum circuit. This quantum circuit is suitable for one-time step of simulation. This means that after a particular cycle of the one-time step of simulation is finished, measurements and re-initialization of the quantum states serving as an input for a next one-time step are required to be performed, or alternative methods for connecting two time steps need to be utilized.

It will be appreciated that there are N working qubits (in total) in the quantum circuit, while ancilla register(s) are introduced for calculation purposes only. If new qubits are introduced into the quantum circuit, they are added into the second quantum register (f2), while the first quantum register (f1) is fixed and comprises four qubits.

Optionally, in the method, the first set of quantum gates (corresponding to the collision step) comprises in a sequential order:

a first SWAP gate that is applied between a last working qubit ($f2_{N-5}$) of the second quantum register (f2) and the ancilla qubit of the first ancilla register (a, a1);

a first rotation operator (Ry) gate that has a Y-axis as a rotation axis, and that uses the ancilla qubit of the first ancilla register (a, a1) as a control corresponding to a state of |0> and uses the last working qubit ($f2_{N-5}$) of the second quantum register (f2) as a target;

a second rotation operator (Ry) gate that has the Y-axis as a rotation axis, and that uses the ancilla qubit of the first ancilla register (a, a1) as a control corresponding to a state of |1> and uses the last working qubit ($f2_{N-5}$) of the second quantum register (f2) as a target;

a first CX gate that uses the ancilla qubit of the first ancilla register (a, a1) as a control corresponding to a state of |1>, and the last working qubit ($f2_{N-5}$) of the second quantum register (f2) as a target; and a second SWAP gate that is applied between the last working qubit ($f2_{N-5}$) of the second quantum register (f2) and the ancilla qubit of the first ancilla register (a, a1).

Figure 3:
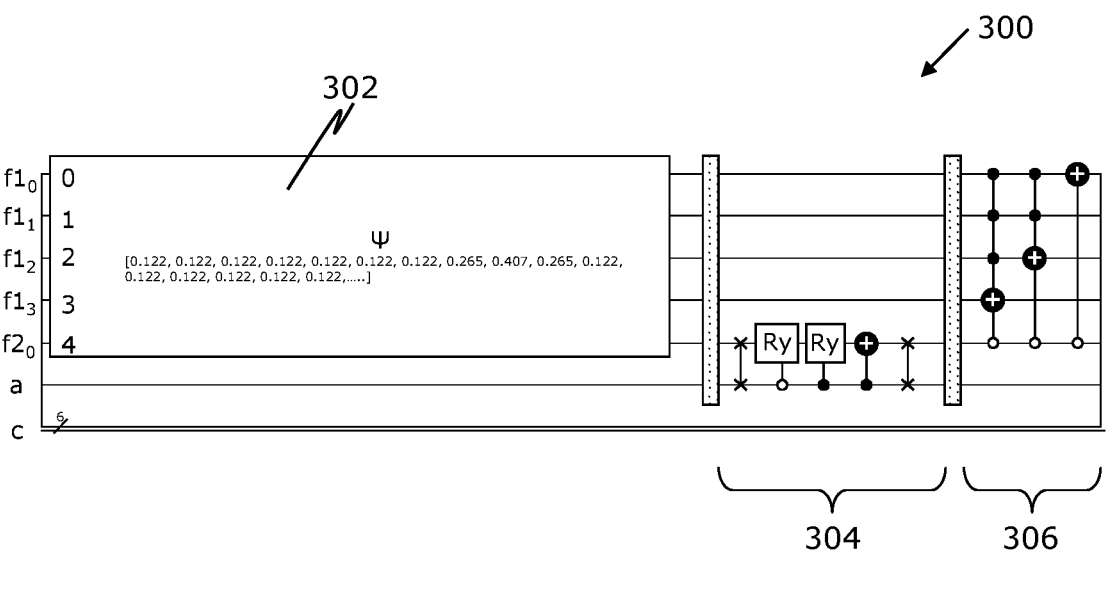
FIG. 3 is a schematic illustration of an optimized quantum circuit utilizing the LBM, in accordance with an embodiment of the present disclosure.
Figure 3:
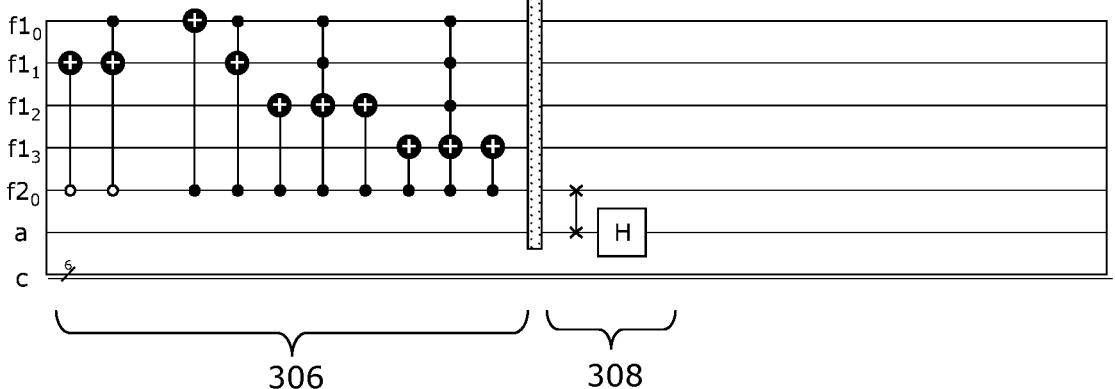
Figure 4A:
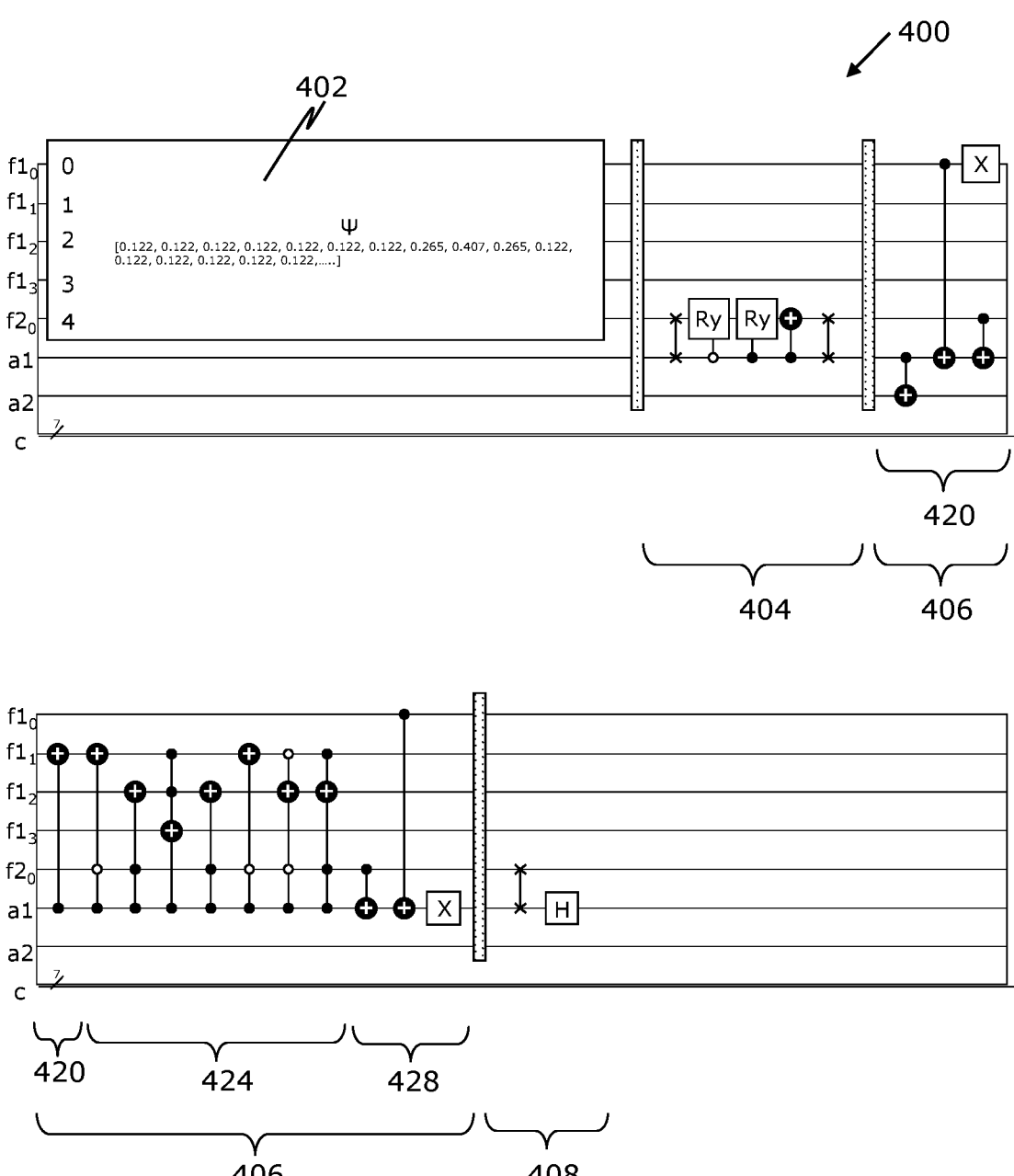
FIG. 4A is a schematic illustration of a further optimized quantum circuit utilizing the LBM, in accordance with an embodiment of the present disclosure.
Figure 4B:
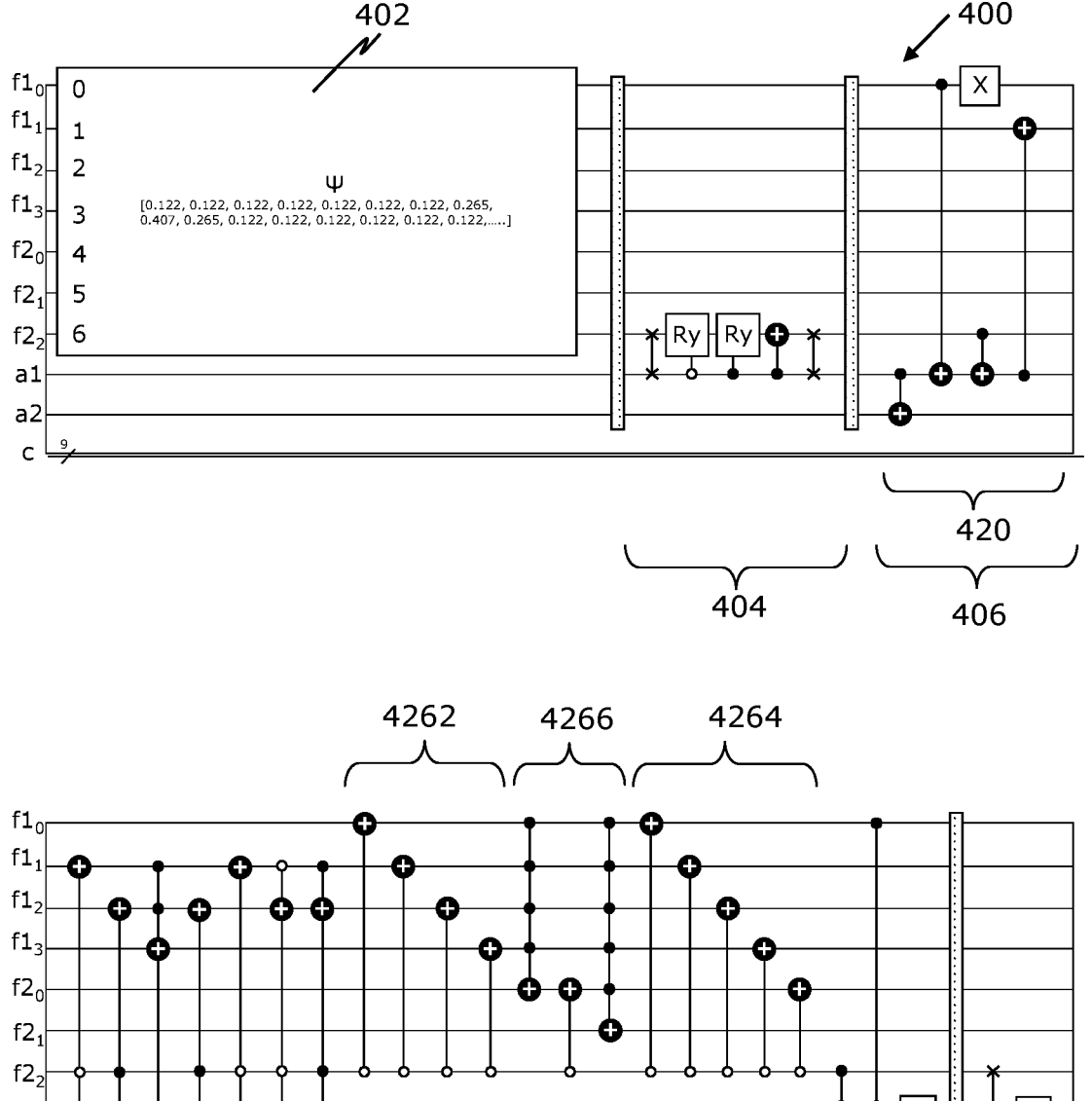
FIG. 4B is another schematic illustration of the further optimized quantum circuit utilizing the LBM, in accordance with an embodiment of the present disclosure.

The first set of quantum gates are illustrated in conjunction with FIGS. 3 and 4A-4B. A first rotation angle and a second rotation angle (to be employed for the first rotation operator gate and the second rotation operator gate, respectively) depend on the parameters provided during the initialization step. Such parameters could be a part of the physical process being simulated. The first rotation angle and the second rotation angle could be provided in radians, for example, as defined in Qiskit.

Throughout the present disclosure, the term "SWAP gate" refers to an operator for swapping the quantum states between two qubits. Throughout the present disclosure, the expressions "use a given qubit as a control" and "use another given qubit as a target" mean that a value of the given qubit (that is "used" as a control) is taken into consideration to decide whether a change is required in a value of the another given qubit (that is "used" as a target). The term "use" with regard to "use a given qubit" is to be understood as employing the given qubit for a particular purpose, namely, as a control or as a target.

Optionally, in the method, the propagation step implements a computational basis state shift. In other words, the second set of gates (corresponding to the propagation step) implement the computational basis state shift. The propagation step is performed for two possible directions. It will be appreciated the computational basis state shift can be implemented in various ways. Some examples of the second set of gates have been provided in conjunction with FIGS. 3 and 4A-4B.

Optionally, in the method, the third set of quantum gates (corresponding to the macroscopic variables calculation step) comprises in a sequential order:

a SWAP gate that is applied between the last working qubit ($f2_{N-5}$) of the second quantum register (f2) and the ancilla qubit of the first ancilla register (a, a1); and a Hadamard gate that is applied to the ancilla qubit of the first ancilla register (a, a1).

In the macroscopic variables calculation step, the SWAP gate is used for state preparation purposes, while the Hadamard gate is used for conducting a pointwise addition procedure. The third set of gates is illustrated in conjunction with FIGS. 2, 3 and 4A-4B.

Referring now to figures, FIG. 1A is a schematic illustration of a quantum computer 100. The quantum computer 100 comprises N qubits, depicted as a first qubit 110a, a second qubit 110b and an N$^{th}$ qubit 110c. The quantum computer 100 also comprises a first ancilla qubit 110d. Each qubit 110a, 110b, 110c is in a superposition of the ground state |0> and the excited state | 1>. The quantum computer 100 further comprises state-preparation means 102 that is to be employed to initialize the quantum computer 100. Moreover, the quantum computer 100 optionally comprises implementation means 104 that is to be employed to set up gates, each gate using one or more of the N qubits, for implementing a quantum algorithm. Furthermore, the quantum computer 100 comprises measurement means 106 that is to be employed to measure a state of one or more of the N qubits after executing the quantum algorithm.

Figure 1B:
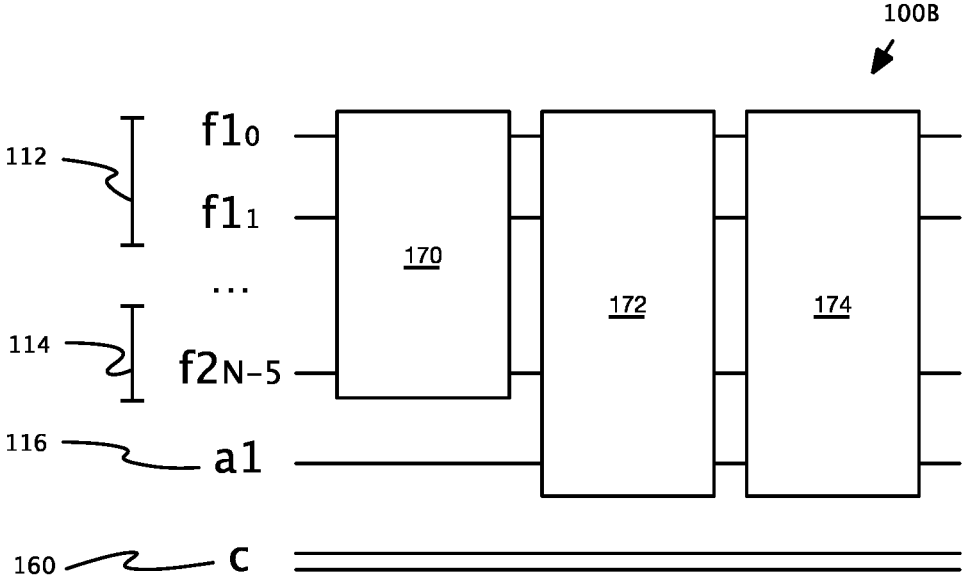
FIG. 1B is a schematic illustration of a quantum circuitry of the quantum computer.

FIG. 1B is a schematic illustration of a quantum circuitry 100B. The quantum circuitry 100B can be illustrated with use of a first quantum register 112 and a second quantum register 114 and a first ancilla register 116. Furthermore, a classical register 160 is also illustrated in the figure. The number of bits in the classical register 160 is equal to the number of qubits in all other registers, namely, the first quantum register 112, the second quantum register 114 and the first ancilla register 116. The term "classical register" refers to lines that provide an interface between a quantum computer and a classical computer.

Mapping of the quantum registers to the quantum computer 100 of FIG. 1A is as follows:

$f1_0$ corresponds to the first qubit 110a, $f1_1$ corresponds to the second qubit 110b, and so on, $f2_{n-5}$ corresponds to the N$^{th}$ qubit 110c.

These N qubits are referred as working qubits. Naming of the registers is arbitrary. In the present disclosure, the first quantum register 112 comprises four working qubits and the second quantum register 114 comprises N−4 working qubits (where N is larger than 4). As an example, if N=6, the first quantum register 112 comprises working qubits $f1_0$, $f1_1$, $f1_2$, $f1_3$ and the second quantum register 114 comprises working qubits $f2_0$, $f2_1$.

With reference to FIG. 1B, the quantum circuitry 100B comprises an initialization phase 170 in which one or more of the qubits are set up with initial states, an implementation phase 172 in which gates making up the corresponding phase are set up in a sequential manner (namely, in a time-variant quantum system), and a measurement phase 174 following the implementation phase 172.

Figure 2:
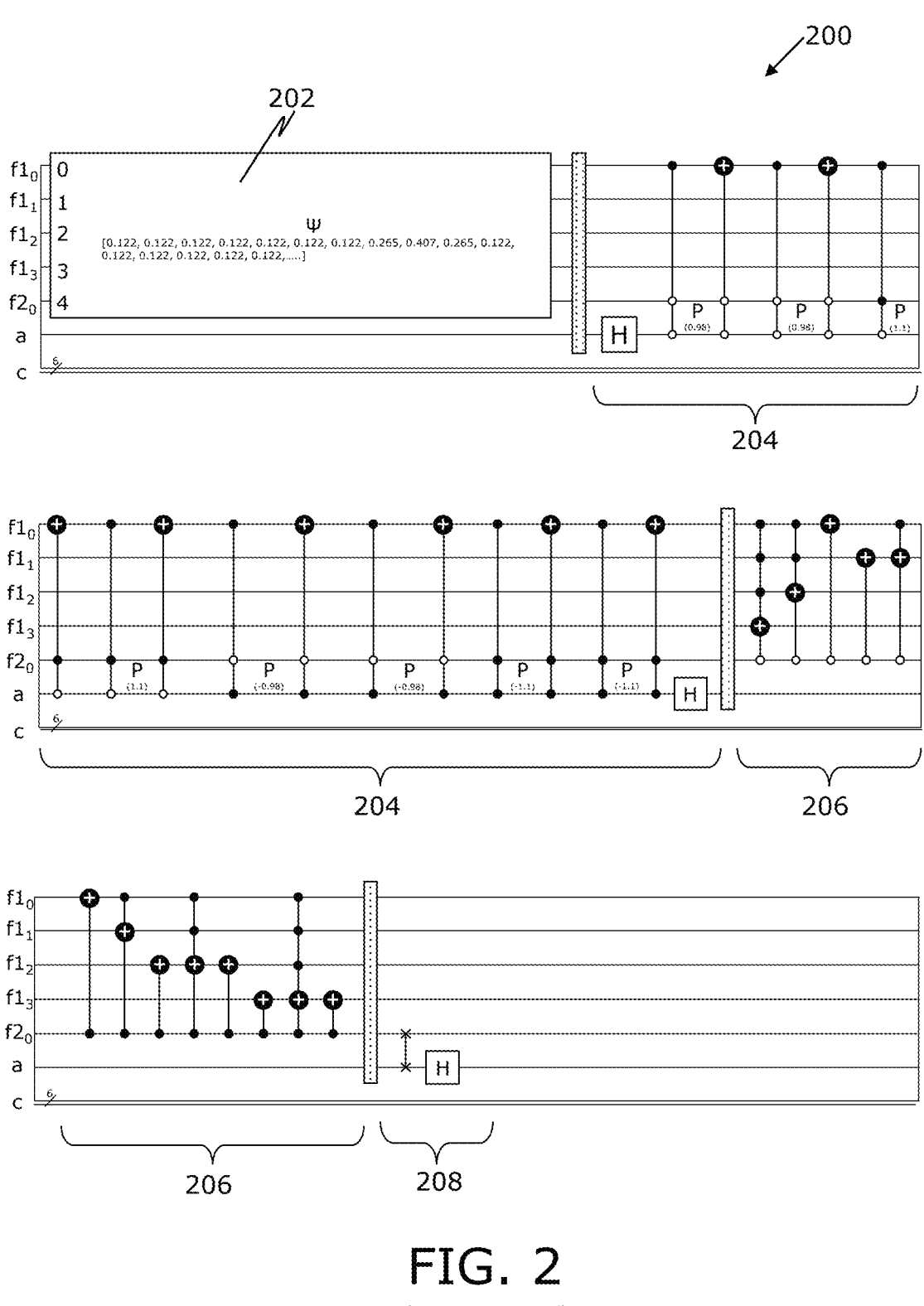
FIG. 2 is a schematic illustration of a non-optimized quantum circuit utilizing the lattice Boltzmann method (LBM)

A non-optimized quantum circuit (which represents the prior art) and two optimized quantum circuits of the present disclosure will now be illustrated with an example of 5 working qubits (N=5), for the sake of comparison. FIG. 2 represents the non-optimized quantum circuit, while FIGS. 3 and 4A-4B represent the optimized quantum circuits of the present disclosure.

FIG. 2 is a schematic illustration of a 5-qubit non-optimized quantum circuit 200 utilizing the LBM; FIG. 2 represents the prior art. The 5-qubit non-optimized quantum circuit 200 is set up using a first quantum register f1 and a second quantum register f2. Total number N of working qubits is 5 in this figure. The number of bits in a classical register c corresponds to the total number of qubits (including both working qubits and ancilla qubits). The 5-qubit non-optimized quantum circuit 200 comprises a non-optimized collision step 204, a non-optimized propagation step 206 and a macroscopic variables calculation step 208. Both the non-optimized collision step 204 and the non-optimized propagation step 206 comprise multiple multi-controlled gates. The gates are implemented in a sequence, i.e., in an order from left to right, as shown in FIG. 2 (and in all further figures illustrating various quantum circuits). It will be appreciated that in the figures, a portion of a quantum circuit, which is drawn below another portion of the quantum circuit, follows the another portion of the quantum circuit in a sequence.

The non-optimized quantum circuit 200 simulates a 1D physical process of a concentration transport along a channel by using the LBM. An example of how such a quantum circuit can be set up is described in "Quantum algorithm for the advection-diffusion equation simulated with the lattice Boltzmann method" by Ljubomir Budinski published in Quantum Information Processing, volume 20, article number: 57 (2021). In the non-optimized quantum circuit 200, there is considered a similar 1D advection-diffusion (ADE) model that contains 16 computational lattice sites. This example has been taken to highlight in detail the technical benefits of the optimized quantum circuits (shown in FIGS. 3 and 4A-4B) of the present disclosure. It will be appreciated that the aforementioned example of the 1D physical problem (namely, the 1D ADE model) with 16 computational lattice sites has been considered for the sake of convenience only; the principles of optimization provided in the present disclosure are generic and not restricted to the aforementioned example.

The non-optimized quantum circuit 200 is required to be optimized, in order to run it on Noisy Intermediate-Scale Quantum (NISQ) devices correctly and efficiently. Except for an initialization step 202, the three steps (namely, the non-optimized collision step 204, the non-optimized propagation step 206 and the macroscopic variables calculation step 208) are separated by grey barriers, to mark their beginning and end.

The problematic sections of the non-optimized quantum circuit 200 are the collision step 204 and the propagation step 206, due to the (conditionally speaking) large number of multi-controlled gates. Before being applied to a real quantum computer, each of these multi-controlled gates are required to be decomposed into a sequence of two-qubit CX gates and other single-qubit gates from a given basis set. Each multi-controlled gate (having more than two controls) is decomposed using a decomposition algorithm. Such decomposition algorithms are well known in the art.

The decomposition depends on the device-specific set of basis gates and the qubit connectivity of the device. As an example, the non-optimized quantum circuit 200 can be decomposed using the IBM set of basis gates (I, SX, X, RZ and CX) with the IBM Qiskit transpiler. The transpilation transforms the general form of the non-optimized quantum circuit 200 (as shown in FIG. 2) into a device-specific set of operations, which can then be executed on quantum hardware.

In the case of the non-optimized quantum circuit 200 (as shown in FIG. 2), the decomposition using IBM's basis gate set gives the following gate counts: RZ=312, CX=244, SX=77, and X=9. These results indicate that the resulting circuit (obtained after the decomposition) is too deep for real device applications, even when assuming full qubit connectivity. In other words, the resulting circuit has too many single-qubit gates (namely, RZ, SX, and X) and two-qubit gates (CX). Notably, the number of two-qubit CX gates is forbiddingly large. In this form, it is not feasible to run the non-optimized quantum circuit 200 on a real device even if some degree of error correction or mitigation is introduced. Hence, further optimization is required.

The present disclosure provides two optimized quantum circuits, which will now be illustrated in junction with FIGS. 3 and 4A-4B.

FIG. 3 is a schematic illustration of a setup of an optimized quantum circuit 300 utilizing the LBM, in accordance with an embodiment of the present disclosure. For comparison purposes, the total number N of working qubits is 5 in this figure. The optimized quantum circuit 300 is set up using a first quantum register f1, a second quantum register f2 and a first ancilla register a, wherein the first quantum register f1 comprises four working qubits (f1$_0$, f1$_1$, f1$_2$, f1$_3$) and the second quantum register f2 comprises N−4 working qubits (f2$_0$, . . . f2$_{N-5}$). The number of qubits in the first ancilla register a is fixed, and is equal to one. The number of bits in a classical register c corresponds to the total number of qubits (including both working qubits and ancilla qubits).

An initialization step 302 has been depicted at the beginning. The optimized quantum circuit 300 comprises an optimized collision step 304, a non-optimized propagation step 306 (similar to that in FIG. 2) and a macroscopic variables calculation step 308. In other words, in the optimized quantum circuit 300, only the collision step 304 is optimized, as compared to the non-optimized collision step 204 of FIG. 2, by reducing the number of quantum gates therein. In particular, the number of quantum gates in the collision step is reduced from 16 multi-controlled gates down to two SWAP gates (x-x), two rotation operator (Ry) gates and one CX gate (as shown in FIG. 3). With reference to FIG. 3, the first set of quantum gates (corresponding to the collision step 304) comprises in a sequential order:

a first SWAP gate that is applied between a last working qubit (f2$_{N-5}$) of the second quantum register f2 and the ancilla qubit of the first ancilla register a;

a first rotation operator (Ry) gate that has a Y-axis as a rotation axis, and that uses the ancilla qubit of the first ancilla register a as a control corresponding to a state of |0> and uses the last working qubit (f2$_{N-5}$) of the second quantum register f2 as a target;

a second rotation operator (Ry) gate that has the Y-axis as a rotation axis, and that uses the ancilla qubit of the first ancilla register a as a control corresponding to a state of |1> and uses the last working qubit (f2$_{N-5}$) of the second quantum register f2 as a target;

a first CX gate that uses the ancilla qubit of the first ancilla register a as a control corresponding to a state of |1>, and the last working qubit (f2$_{N-5}$) of the second quantum register f2 as a target; and a second SWAP gate that is applied between the last working qubit (f2$_{N-5}$) of the second quantum register f2 and the ancilla qubit of the first ancilla register a.

In the case of the optimized quantum circuit 300 (as shown in FIG. 3), the decomposition using IBM's basis gate set gives the following gate counts: RZ=189, CX=145, SX=68, and X=4. It is evident that with the optimization of the collision step only, a significant reduction in the number of quantum gates is achieved. Particularly, the number of CX gates (which is the most problematic part of the quantum circuit in terms of real device implementation) is reduced by 41 percent.

Referring next to FIGS. 4A and 4B, depicted are schematic illustrations of a setup of a further optimized quantum circuit 400 utilizing the LBM, in accordance with an embodiment of the present disclosure. For comparison purposes, the total number N of working qubits is 5 in FIG. 4A also. Furthermore, to show an optional modular section of a propagation step of the further optimized quantum circuit 400, the total number N of working qubits is 7 in FIG. 4B.

The further optimized quantum circuit 400 is set up using a first quantum register f1, a second quantum register f2 and two ancilla registers a1 and a2, wherein the first quantum register f1 comprises four working qubits ($f1_0$, $f1_1$, $f1_2$, $f1_3$) and the second quantum register f2 comprises N–4 working qubits ($f2_0$, . . . $f2_{N-5}$). The number of qubits in each of the ancilla registers a1 and a2 is fixed, and is equal to one. The number of bits in the classical register c corresponds to the total number of qubits (including both working qubits and ancilla qubits).

An initialization step 402 has been depicted at the beginning. The further optimized quantum circuit 400 comprises an optimized collision step 404 (similar to that in FIG. 3), an optimized propagation step 406 and a macroscopic variables calculation step 408. In other words, in the further optimized quantum circuit 400, both the collision step 404 and the propagation step 406 are optimized, as compared to the non-optimized collision step 204 and the non-optimized propagation step 206 of FIG. 2, by reducing the number of quantum gates therein.

With reference to FIGS. 4A and 4B, the first set of quantum gates (corresponding to the collision step 404) comprises in a sequential order:

a first SWAP gate that is applied between a last working qubit ($f2_{N-5}$) of the second quantum register f2 and the ancilla qubit of the first ancilla register a1;

a first rotation operator (Ry) gate that has a Y-axis as a rotation axis, and that uses the ancilla qubit of the first ancilla register a1 as a control corresponding to a state of |0> and uses the last working qubit ($f2_{N-5}$) of the second quantum register f2 as a target;

a second rotation operator (Ry) gate that has the Y-axis as a rotation axis, and that uses the ancilla qubit of the first ancilla register a1 as a control corresponding to a state of | 1> and uses the last working qubit ($f2_{N-5}$) of the second quantum register f2 as a target;

a first CX gate that uses the ancilla qubit of the first ancilla register a1 as a control corresponding to a state of |1>, and the last working qubit ($f2_{N-5}$) of the second quantum register f2 as a target; and a second SWAP gate that is applied between the last working qubit ($f2_{N-5}$) of the second quantum register f2 and the ancilla qubit of the first ancilla register a1.

The propagation step 206 (representing a spatial evolution of the distribution functions in left and right direction) of FIG. 2 is replaced by an evolution of one general vector of states encoding the distribution functions, leading to an additional depth-reduction of the circuit. Optionally, in this regard, the second set of quantum gates (corresponding to the propagation step 406) comprises in a sequential order:

(i) an initial step 420 comprising four CX gates and a first X gate;

(ii) a first segment 424 comprising seven multi-controlled gates;

(iii) if N>5, a second segment 426 comprising a first set of CX gates 4262, a second set of CX gates 4264 and a cascade of gates 4266 arranged between the first set 4262 and the second set 4264; and (iv) a third segment 428 comprising two CX gates, and a second X gate.

With reference to FIG. 4A, N=5; therefore, the further optimized quantum circuit 400 of FIG. 4A does not include the second segment 426 of the propagation step. In other words, the second segment 426 is completely omitted when N is not greater than 5. With reference to FIG. 4B, N=7; therefore, the further optimized quantum circuit 400 of FIG. 4B comprises the second segment 426 of the propagation step.

Optionally, the four CX gates of the initial step 420 are applied in a sequential order of:

a first CX gate of the initial step 420 that uses the ancilla qubit of the first ancilla register a1 as a control corresponding to a state of |1>, and the ancilla qubit of the second ancilla register a2 as a target;

a second CX gate of the initial step 420 that uses a first working qubit ($f1_0$) of the first quantum register f1 as a control corresponding to a state of |1>, and the ancilla qubit of the first ancilla register a1 as a target;

a third CX gate of the initial step 420 that uses the last working qubit ($f2_{N-5}$) of the second quantum register f2 as a control corresponding to a state of |1>, and the ancilla qubit of the first ancilla register a1 as a target; and a fourth CX gate of the initial step 420 that uses the ancilla qubit of the first ancilla register a1 as a control corresponding to a state of |1>, and a second working qubit ($f1_1$) of the first quantum register f1 as a target; and the first X gate of the initial step 420 is applied to the first working qubit ($f1_0$) of the first quantum register f1.

Optionally, the seven multi-controlled gates of the first segment 424 are applied in a sequential order of: a first multi-controlled gate, a second multi-controlled gate, a third multi-controlled gate, a fourth multi-controlled gate, a fifth multi-controlled gate, a sixth multi-controlled gate, and a seventh multi-controlled gate, wherein:

the first multi-controlled gate and the fifth multi-controlled gate use the last working qubit ($f2_{N-5}$) of the second quantum register f2 as a first control corresponding to a state of |0>, the ancilla qubit of the first ancilla register a1 as a second control corresponding to a state of |1>, and the second working qubit ($f1_1$) of the first quantum register f1 as a target;

the second multi-controlled gate and the fourth multi-controlled gate use the last working qubit ($f2_{N-5}$) of the second quantum register f2 and the ancilla qubit of the first ancilla register a1 as controls corresponding to a state of |1>, and a third working qubit ($f1_2$) of the first quantum register f1 as a target;

the third multi-controlled gate uses the second working qubit ($f1_1$) of the first quantum register f1, the third working qubit ($f1_2$) of the first quantum register f1 and the ancilla qubit of the first ancilla register a1 as controls corresponding to a state of | 1>, and a fourth working qubit ($f1_3$) of the first quantum register f1 as a target;

the sixth multi-controlled gate uses the second working qubit ($f1_1$) of the first quantum register f1 and the last working qubit ($f2_{N-5}$) of the second quantum register f2 as controls corresponding to a state of |0>, the ancilla qubit of the first ancilla register a1 as a control corresponding to a state of $|1\rangle$, and the third working qubit ($f1_2$) of the first quantum register f1 as a target; and the seventh multi-controlled gate uses the second working qubit ($f1_1$) of the first quantum register f1, the last working qubit ($f2_{N-5}$) of the second quantum register f2 and the ancilla qubit of the first ancilla register a1 as controls corresponding to a state of $|1\rangle$, and the third working qubit ($f1_2$) of the first quantum register f1 as a target.

Moreover, optionally, the two CX gates and the second X gate of the third segment 428 are applied in a sequential order of:

a first CX gate of the third segment 428 that uses the last working qubit ($f2_{N-5}$) of the second quantum register f2 as a control corresponding to a state of $|1\rangle$, and the ancilla qubit of the first ancilla register a1 as a target; and a second CX gate of the third segment 428 that uses the first working qubit ($f1_0$) of the first quantum register f1 as a control corresponding to a state of $|1\rangle$, and the ancilla qubit of the first ancilla register a1 as a target, wherein the second X gate of the third segment 428 is applied to the ancilla qubit of the first ancilla register a1.

The aforementioned optimization of the propagation step brings additional technical benefits. One technical benefit is that when the number of working qubits is increased, only the second segment 426 of the propagation step is required to be changed by adding more gates to the second set of CX gates 4264 and the cascade of gates 4266. It will be appreciated that when an additional qubit is introduced in the quantum circuit, there is no change in the initial step 420, the first segment 424 and the third segment 428. In particular, there is no change in the number of controls in the seven multi-controlled gates of the first segment 424. As a result, the further optimized quantum circuit 400 is susceptible to be scaled up easily. Moreover, the scale up of the further optimized quantum circuit 400 is much less expensive as compared to the scale up of the non-optimized quantum circuit 200.

In the case of the further optimized quantum circuit 400 (as shown in FIG. 4A), the decomposition using IBM's basis gate set gives the following gate counts: RZ=129, CNOT=86, SX=50, and X=12. It is evident that with the optimization of both the collision step and the propagation step, a much significant reduction in the number of quantum gates is achieved. In terms of CX gates, there is a 41 percent further reduction, and a 65 percent reduction in total as compared to the non-optimized quantum circuit 200 of FIG. 2. In the case of Z-axis rotation gates RZ, this total reduction is 59 percent. These results show that significant optimization of the non-optimized quantum circuit 200 (of FIG. 2) is accomplished, thereby making the further optimized quantum circuit 400 fully applicable for running on real quantum devices. In other words, such a significant reduction in the number of multi-control gates makes the further optimized quantum circuit 400 even more short, efficient and therefore resistant to errors.

A comparison of gate counts is shown in a table below. It will be appreciated that an exact gate count is always device specific; herein, the IBM basis gate set {RZ, SX, X, CX} has been used, with an assumption of full qubit connectivity.

| | Non-optimized QC 200 | Further optimized QC 400 |
|---|---|---|
| CX gates | 244 | 86 |
| Single qubit gates | 398 | 191 |
| Total | 642 | 277 |

With reference to FIG. 4B, optionally, the first set of CX gates 4262 of the second segment 426 comprises four CX gates that use in following order: the first working qubit ($f1_0$), the second working qubit ($f1_1$), the third working qubit ($f1_2$) and the fourth working qubit ($f1_3$) of the first quantum register f1 as respective targets, each of the four CX gates of the first set of CX gates 4262 using the last working qubit ($f2_{N-5}$) of the second quantum register f2 as a control corresponding to a state of $|0\rangle$.

Additionally, optionally, the second set of CX gates 4264 of the second segment 426 comprises N−2 CX gates that use in following order: the first working qubit ($f1_0$), the second working qubit ($f1_1$), the third working qubit ($f1_2$) and up to (N−2)$^{th}$ working qubit as respective targets, each of the N−2 CX gates of the second set of CX gates 4264 using the last working qubit ($f2_{N-5}$) of the second quantum register f2 as a control corresponding to a state of $|0\rangle$. Herein, the (N−2)$^{th}$ working qubit could be a working qubit of the first quantum register (f1) or the second quantum register (f2) depending on the value of N. As an example, for N=6, the second set of CX gates 4264 would comprise four CX gates, and the (N−2)$^{th}$ working qubit is a 4th working qubit in the quantum circuit, which is the fourth working qubit ($f1_3$) of the first quantum register f1, which is used as the target of the last one of the four CX gates. For N>6, the (N−2)$^{th}$ working qubit is a working qubit ($f2_{N-7}$) of the second quantum register f2. As shown in FIG. 4B, for N=7, the second set of CX gates 4264 comprises five CX gates, and the (N−2)$^{th}$ working qubit is the first working qubit ($f2_0$) of the second quantum register f2, which is used as the target of the last one of the five CX gates.

Yet additionally, optionally, the cascade of gates 4266 is arranged after the first set of CX gates 4262 and before the second set of CX gates 4264, and wherein the number of gates in the cascade is a function of a total number (N) of working qubits. It will be appreciated that the second set of CX gates 4264 and the cascade of gates 4266 are dependent on the value of N, and allow for easy scaling up of the further optimized quantum circuit 400.

Optionally, the cascade of the gates 4266 comprises:

N−5 multi-controlled gates arranged as a sequence of gates indexed from 1 to N−5, wherein within the sequence, a multi-controlled gate indexed 'M' uses as controls all working qubits in the first quantum register f1 and M−1 first working qubits of the second quantum register f2, wherein the controls correspond to a state of $|1\rangle$, and uses as a target M$^{th}$ working qubit of the second quantum register f2; and N−6 CX gates, if N is greater than 6, wherein the N−5 multi-controlled gates and the N−6 CX gates are arranged in an interleaved manner, the cascade of the gates 4266 starting with a first multi-controlled gate from amongst the N−5 multi-controlled gates, each CX gate using the last working qubit ($f2_{N-5}$) of the second quantum register f2 as a control corresponding to a state of $|0\rangle$, wherein an L$^{th}$ CX gate uses as a target a same working qubit that is used as a target by an L$^{th}$ multi-controlled gate.

It will be appreciated that the second segment 426 of the propagation step is a modular segment. An addition of each new qubit into the quantum circuit introduces one multi-controlled gate with N−2 controls (starting from the first working qubit $(f1_0)$) and two CX gates having the last working qubit $(f2_{N-5})$ as a control and a third last working qubit $(f2_{N-7})$ as a target. This dynamic is maintained for each new qubit that is added to the quantum circuit.

Experimental Part

Figure 5:
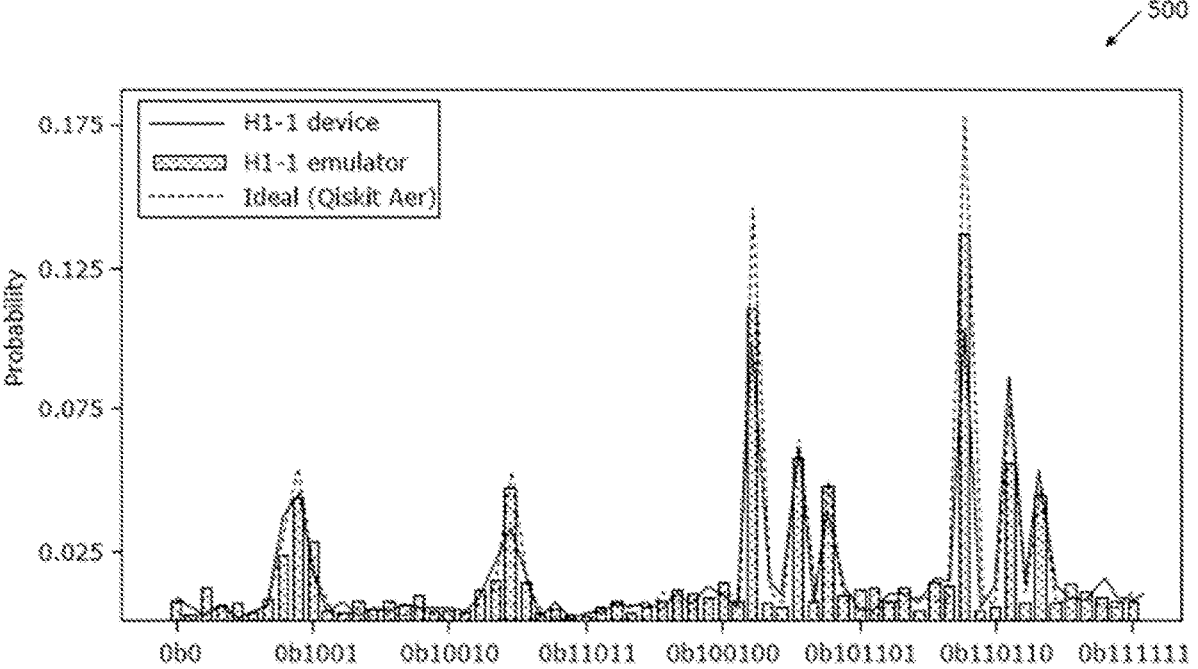
FIGS. 5 and 6 are graphs illustrating a comparison of results of experiments performed using a Quantinuum H-series device H1-1 and H1-2 emulator, respectively.
Figure 6:
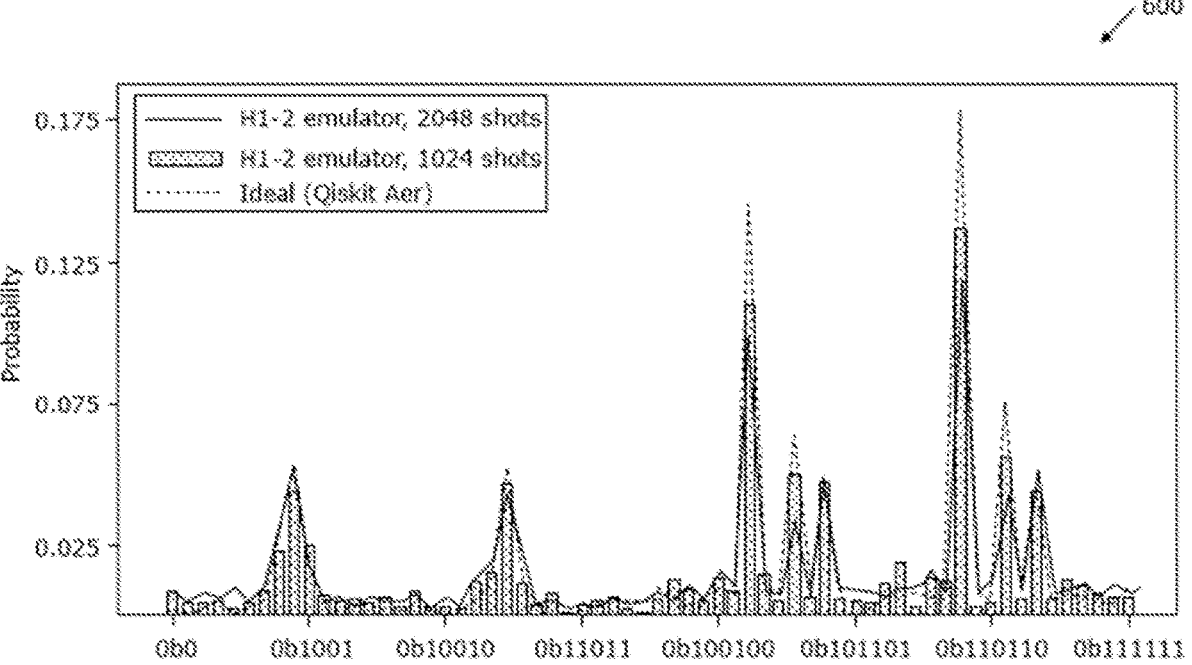

The optimization of the quantum circuit utilizing the LBM (for example, the further optimized quantum circuit 400) opens up a possibility of running the simulation of the physical process on a real quantum device. This has been illustrated on a Quantinuum H-series device H1-1, where a comparison of the results in the form of lattice Boltzmann probability distribution functions against ideal and emulated values are presented in FIG. 5. In this regard, 1D advection-diffusion equation was solved on the Quantinuum H1-1 device, with comparison to H1-1 emulation and low-noise "ideal" simulation provided by Qiskit Aer. A desired solution to the physical problem can be obtained from the measurement distribution with a simple post-processing step. The physically relevant states are displayed on the left half of the distribution graph. The shot count in all runs was set to 1024. Furthermore, FIG. 6 depicts results from two different runs on a Quantinuum H-series device H1-2 emulator, which is again compared with the ideal values. Herein too, the 1D advection-diffusion equation was solved on the Quantinuum H1-2 emulator with two different shot counts, and compared to the low-noise "ideal" simulation provided by Qiskit Aer.

It is evident from these results that a high level of overlap is achieved between measured values and the emulated values as well as between the measured values and the ideal values. This confirms the high efficiency of the aforesaid optimization. As the Quantinuum emulators are capable of replicating the real quantum device to a reasonable accuracy, they provide a very good indication of how the optimized quantum circuit would function on the real quantum device.

The present disclosure also relates to a quantum computer or a quantum simulator configured to execute the aforementioned method for setting up the quantum circuit utilizing the LBM as described above. The present disclosure further relates to a non-transitory computer-readable medium having computer program instructions stored thereon, the computer program instructions being executable by at least one processor in a classical computer to control a quantum computer or a quantum simulator to perform the aforementioned method. Various embodiments and variants disclosed above, with respect to the aforementioned method, apply mutatis mutandis to the quantum computer or the quantum simulator, and to the non-transitory computer-readable medium.

The invention claimed is:

1. A method for setting up a quantum circuit utilizing a lattice Boltzmann method, the method comprising:

performing an initialization step by setting up for the quantum circuit, a first quantum register (f1), a second quantum register (f2) and at least a first ancilla register (a, a1), wherein the first quantum register (f1) comprises four qubits $(f1_0, f1_1, f1_2, f1_3)$, the second quantum register (f2) comprises N−4 qubits $(f2_0, \ldots f2_{N-5})$, and the first ancilla register (a, a1) comprises an ancilla qubit; and applying the quantum circuit to the first quantum register (f1), the second quantum register (f2) and the first ancilla register (a, a1), wherein the quantum circuit comprises in a sequential order:

(i) a collision step constructed using a first set of quantum gates;

(ii) a propagation step constructed using a second set of quantum gates; and (iii) a macroscopic variables calculation step constructed using a third set of quantum gates; and wherein the first set of quantum gates comprises in a sequential order:

a first SWAP gate that is applied between a last working qubit $(f2_{N-5})$ of the second quantum register (f2) and the ancilla qubit of the first ancilla register (a, a1);

a first rotation operator (Ry) gate that has a Y-axis as a rotation axis, and that uses the ancilla qubit of the first ancilla register (a, a1) as a control corresponding to a state of |0> and uses the last working qubit $(f2_{N-5})$ of the second quantum register (f2) as a target;

a second rotation operator (Ry) gate that has the Y-axis as a rotation axis, and that uses the ancilla qubit of the first ancilla register (a, a1) as a control corresponding to a state of |1> and uses the last working qubit $(f2_{N-5})$ of the second quantum register (f2) as a target;

a first CX gate that uses the ancilla qubit of the first ancilla register (a, a1) as a control corresponding to a state of |1>, and the last working qubit $(f2_{N-5})$ of the second quantum register (f2) as a target; and a second SWAP gate that is applied between the last working qubit $(f2_{N-5})$ of the second quantum register (f2) and the ancilla qubit of the first ancilla register (a, a1).

2. The method according to claim 1, further comprising simulating a physical process by performing the collision step, the propagation step and the macroscopic variables calculation step of the quantum circuit.

3. The method according to claim 2, further comprising:

generating a mathematical formulation corresponding to the physical process;

numerically discretizing the mathematical formulation by using the lattice Boltzmann method; and constructing the collision step, the propagation step and the macroscopic variables calculation step of the quantum circuit, based on the numerically-discretized mathematical formulation.

4. The method according to claim 3, wherein the mathematical formulation is a one-dimensional advection-diffusion equation.

5. The method according to claim 1, wherein the propagation step implements a computational basis state shift.

6. The method according to claim 1, wherein the third set of quantum gates comprises in a sequential order:

a SWAP gate that is applied between the last working qubit $(f2_{N-5})$ of the second quantum register (f2) and the ancilla qubit of the first ancilla register (a, a1); and a Hadamard gate that is applied to the ancilla qubit of the first ancilla register (a, a1).

7. The method according to claim 1, wherein the second set of quantum gates comprises in a sequential order:

an initial step comprising four CX gates and a first X gate;

a first segment comprising seven multi-controlled gates;

if N>5, a second segment comprising a first set of CX gates, a second set of CX gates, and a cascade of gates arranged between the first set and the second set; and a third segment comprising two CX gates and a second X gate.

8. The method according to claim 7, wherein the four CX gates of the initial step are applied in a sequential order of:

a first CX gate of the initial step that uses an ancilla qubit of the first ancilla register (a1) as a control corresponding to a state of $|1\rangle$, and an ancilla qubit of a second ancilla register (a2) as a target;

a second CX gate of the initial step that uses a first working qubit ($f1_0$) of the first quantum register (f1) as a control corresponding to a state of $|1\rangle$, and the ancilla qubit of the first ancilla register (a1) as a target;

a third CX gate of the initial step that uses a last working qubit ($f2_{N-5}$) of the second quantum register (f2) as a control corresponding to a state of $|1\rangle$, and the ancilla qubit of the first ancilla register (a1) as a target; and a fourth CX gate of the initial step that uses the ancilla qubit of the first ancilla register (a1) as a control corresponding to a state of $|1\rangle$, and a second working qubit ($f1_1$) of the first quantum register (f1) as a target; and the first X gate of the initial step is applied to the first working qubit ($f1_0$) of the first quantum register (f1).

9. The method according to claim 7, wherein the seven multi-controlled gates of the first segment are applied in a sequential order of: a first multi-controlled gate, a second multi-controlled gate, a third multi-controlled gate, a fourth multi-controlled gate, a fifth multi-controlled gate, a sixth multi-controlled gate, and a seventh multi-controlled gate, wherein:

the first multi-controlled gate and the fifth multi-controlled gate use the last working qubit ($f2_{N-5}$) of the second quantum register (f2) as a first control corresponding to a state of $|0\rangle$, the ancilla qubit of the first ancilla register (a1) as a second control corresponding to a state of $|1\rangle$, and the second working qubit ($f1_1$) of the first quantum register (f1) as a target;

the second multi-controlled gate and the fourth multi-controlled gate use the last working qubit ($f2_{N-5}$) of the second quantum register (f2) and the ancilla qubit of the first ancilla register (a1) as controls corresponding to a state of $|1\rangle$, and a third working qubit ($f1_2$) of the first quantum register (f1) as a target;

the third multi-controlled gate uses the second working qubit ($f1_1$) of the first quantum register (f1), the third working qubit ($f1_2$) of the first quantum register (f1) and the ancilla qubit of the first ancilla register (a1) as controls corresponding to a state of $|1\rangle$, and a fourth working qubit ($f1_3$) of the first quantum register (f1) as a target;

the sixth multi-controlled gate uses the second working qubit ($f1_1$) of the first quantum register (f1) and the last working qubit ($f2_{N-5}$) of the second quantum register (f2) as controls corresponding to a state of $|0\rangle$, the ancilla qubit of the first ancilla register (a1) as a control corresponding to a state of $|1\rangle$, and the third working qubit ($f1_2$) of the first quantum register (f1) as a target; and the seventh multi-controlled gate uses the second working qubit ($f1_1$) of the first quantum register (f1), the last working qubit ($f2_{N-5}$) of the second quantum register (f2) and the ancilla qubit of the first ancilla register (a1) as controls corresponding to a state of $|1\rangle$, and the third working qubit ($f1_2$) of the first quantum register (f1) as a target.

10. The method according to claim 7, wherein the first set of CX gates of the second segment comprises four CX gates that use in following order: the first working qubit ($f1_0$), the second working qubit ($f1_1$), the third working qubit ($f1_2$) and the fourth working qubit ($f1_3$) of the first quantum register (f1) as respective targets, each of the four CX gates of the first set of CX gates using the last working qubit ($f2_{N-5}$) of the second quantum register (f2) as a control corresponding to a state of $|0\rangle$;

wherein the second set of CX gates of the second segment comprises N–2 CX gates that use in following order: the first working qubit ($f1_0$), the second working qubit ($f1_1$), the third working qubit ($f1_2$) and up to $(N-2)^{th}$ working qubit as respective targets, each of the N–2 CX gates of the second set of CX gates using the last working qubit ($f2_{N-5}$) of the second quantum register (f2) as a control corresponding to a state of $|0\rangle$; and wherein the cascade of gates is arranged after the first set of CX gates and before the second set of CX gates, and wherein the number of gates in the cascade is a function of a total number (N) of working qubits.

11. The method according to claim 10, wherein the cascade of the gates comprises:

N–5 multi-controlled gates arranged as a sequence of gates indexed from 1 to N–5, wherein within the sequence, a multi-controlled gate indexed 'M' uses as controls all working qubits in the first quantum register (f1) and M–1 first working qubits of the second quantum register, wherein the controls correspond to a state of $|1\rangle$, and uses as a target $M^{th}$ working qubit of the second quantum register (f2); and N–6 CX gates, if N is greater than 6, wherein the N–5 multi-controlled gates and the N–6 CX gates are arranged in an interleaved manner, the cascade of the gates starting with a first multi-controlled gate from amongst the N–5 multi-controlled gates, each CX gate using the last working qubit ($f2_{N-5}$) of the second quantum register (f2) as a control corresponding to a state of $|0\rangle$, wherein an $L^{th}$ CX gate uses as a target a same working qubit that is used as a target by an $L^{th}$ multi-controlled gate.

12. The method according to claim 7, wherein the two CX gates and the second X gate of the third segment are applied in a sequential order of:

a first CX gate of the third segment that uses the last working qubit ($f2_{N-5}$) of the second quantum register (f2) as a control corresponding to a state of $|1\rangle$, and the ancilla qubit of the first ancilla register (a1) as a target; and a second CX gate of the third segment that uses the first working qubit ($f1_0$) of the first quantum register (f1) as a control corresponding to a state of $|1\rangle$, and the ancilla qubit of the first ancilla register (a1) as a target, wherein the second X gate of the third segment is applied to the ancilla qubit of the first ancilla register (a1).

13. A quantum computer or a quantum simulator configured to execute a method according to claim 1.

14. A non-transitory computer-readable medium having computer program instructions stored thereon, the computer program instructions being executable by at least one processor in a classical computer to control a quantum computer or a quantum simulator to perform a method according to claim 1.

\* \* \* \* \*